United States Patent [19]

Chapman et al.

[11] Patent Number: 5,113,451
[45] Date of Patent: May 12, 1992

[54] METHOD FOR LABELLING POLYGONS

[75] Inventors: David C. Chapman; Herve G. Duprez, both of Campbell, Calif.

[73] Assignee: VLSI Technology, Inc., San Jose, Calif.

[21] Appl. No.: 422,332

[22] Filed: Oct. 16, 1989

[51] Int. Cl.⁵ .......................... G06K 9/00; G06K 9/34; G06K 9/46; G06K 9/20
[52] U.S. Cl. .......................... 382/8; 382/9; 382/26; 382/28; 382/48; 377/10
[58] Field of Search .................. 382/26, 25, 8, 28, 48, 382/9; 377/10

[56] References Cited

U.S. PATENT DOCUMENTS

| | | | |
|---|---|---|---|
| 4,183,013 | 1/1980 | Aragawala et al. | 382/26 |
| 4,189,711 | 2/1980 | Frank | 382/26 |
| 4,624,013 | 11/1986 | Urushibata | 382/26 |
| 4,630,306 | 12/1986 | West et al. | 382/26 |
| 4,718,090 | 1/1988 | Cooper, Jr. | 382/26 |
| 5,018,214 | 5/1991 | Pasch | 382/26 |

OTHER PUBLICATIONS

"Fast Algorithms for LSI Artwork Analysis" by Henry S. Baird, pp. 179-208 in Journal of Design Automation & Fault-Tolerant Computing, May 1978, vol. 2, No. 2.
"Plane Sweep Algorithms for Intersecting Geometric Figures", J. Nievergelt et al. pp. 739-747, Communications of the ACM, Oct. 1982, vol. 25, No. 10.
"Topological Analysis for VSLI Circuits" by Losleben et al. pp. 461-473, Department of Defense.
"An Integrated Mask Artwork Analysis System" by Mitsuhashi et al, pp. 277-284; 1980 ACM.
Thomas G. Szymanski, Space Efficient Algorithms for VSLI Artwork Analysis (1983).

Primary Examiner—Michael Razavi
Assistant Examiner—Michael Cammarata
Attorney, Agent, or Firm—Burns, Doane, Swecker & Mathis

[57] ABSTRACT

A method for labelling polygons of a geometric layout which includes the steps of scanning a geometric layout during a first scan line pass to detect objects which form a polygon, processing the scan line at each occurrence of an event to detect the objects which contact the scan line, assigning temporary numbers and root designators to the objects which contact the scan line in accordance with a sorting criterion, updating the temporary numbers assigned to the objects to keep the temporary number associated with the earliest root designator of each separately detected polygon, and renaming each object which forms a part of the same polygon with a common label. The step of updating includes the steps of numbering each object in a polygon with a temporary number assigned to a root object of the polygon, and storing, in a sorted order, the root objects which lose their status as root objects during the step of updating.

26 Claims, 4 Drawing Sheets

FIG._1

```
OBJECT 1 DATA
OBJECT 2 DATA
OBJECT 3 DATA
OBJECT 4 DATA
OBJECT 5 DATA
OBJECT 6 DATA
OBJECT 7 DATA
```

INPUT FILE

METHOD FOR LABELLING POLYGONS

BACKGROUND OF THE INVENTION

1. Field of the Invention

The present invention generally relates to a method of labelling polygons during integrated circuit network analysis. More specifically, the present invention relates to the analysis of an integrated circuit layout.

2. State of the Art

Integrated circuit analysis is often performed for verifying whether integrated circuit design rules have been followed and an integrated circuit correctly implemented. Design rules are utilized during a chip design process to insure that the integrated circuit layout designs are functional and capable of manufacture. For example, the design rules may prohibit a circuit layout from being designed with short circuits among the chip's layers. Integrated circuit analysis is also performed to verify that the electrical interconnections of a semiconductor chip correspond to an originally intended design once it has been determined that the design rules have been followed correctly (i.e., connectivity analysis).

Integrated circuit analysis for design rule checking and/or connectivity analysis is performed by examining the physical circuit layout geometry of a semiconductor integrated circuit which is to be, or has been, fabricated during a computer controlled process (e.g., a lithography process using optical methods or an electron beam machine). During this examination of the circuit layout for a chip, an actual netlist is generated which represents the interconnections of all elements on the chip.

To perform a check of a chip layout's functionality or electrical connectivity, or to ensure that the design rules have been followed, a circuit geometry is analyzed to extract an actual netlist for comparison with a netlist representative of the desired electrical connectivity. If the actual netlist generated during the circuit analysis does not agree with the desired netlist, it is likely that an error exists in the computer software for constructing the layout.

Integrated circuit analysis for connectivity analysis is also useful to verify that important interconnections on a chip are still present following human interaction with the design of the chip. For example, a designer must draw a circuit layout geometry to match the desired netlist. In addition, the designer will often make minor adjustments to the layout of a chip following the original design. It is therefore important that the completed chip be examined to verify that the actual netlist associated with the chip corresponds to the originally intended netlist.

Such a qualification of the connectivity of the chip is important when, for example, a manufacturer has been hired to produce chips having a requested design. Integrated circuit analysis is used in this case to verify that the designer has produced a circuit layout which complies with the pre-established design specifications requested. In this regard, integrated circuit analysis can also be used to, for example, verify the specific spacing between two layers of the chip's circuit layout, and so forth.

The integrated circuit analysis of a chip layout is preferably performed prior to actual manufacturing of the chip because such an analysis is relatively cost-effective. However, a similar analysis could be performed on a chip layout after it has been manufactured to verify the connectivity of the circuit components on the completed chip.

With integrated circuit layout analysis, it is often necessary to differentiate between portions of the circuit layout which are on the same electrical node from portions of the circuit layout which are not on the same electrical node. An electrical node is an area or zone of electrical contact on the circuit layout. Such a differentiation is achieved during integrated circuit analysis by examining the chip's circuit layout, wherein the components of the circuit layout appear as a number of polygonal shapes. Each polygon represents an electrical node, such that components which form a particular polygon are part of the same electrical node.

A polygon is a region bounded by some number of edges, no two of which intersect at any point other than their endpoints. Each polygon may be represented by breaking it down into a number of objects, for example edges, which are stored in an input file. For example, referring to FIG. 1, an integrated circuit layout for a semiconductor chip SC is shown. The circuit layout shown in FIG. 1 includes two polygons labelled A and B which form two separate electrical nodes on the chip layer shown. The polygon labelled A has been broken down for the purposes of integrated circuit analysis into the objects "1" through "5", while the polygon labelled B has been broken down into the objects "6" to "7".

During the integrated circuit analysis of a chip or chip layout, design rule checking and/or connectivity analysis is performed by determining the interrelationships of the objects in the circuit layout. Accordingly, each of the objects which appear in the circuit layout is detected during the integrated circuit analysis. To determine the interrelationship of the objects, it is desirable to correlate an identifying mark with all of the objects that are a part of the same polygon and thus, part of the same electrical node. Although the form of the identifying mark is arbitrary (for example, a number), it must be unique for each polygon.

Figure 1:
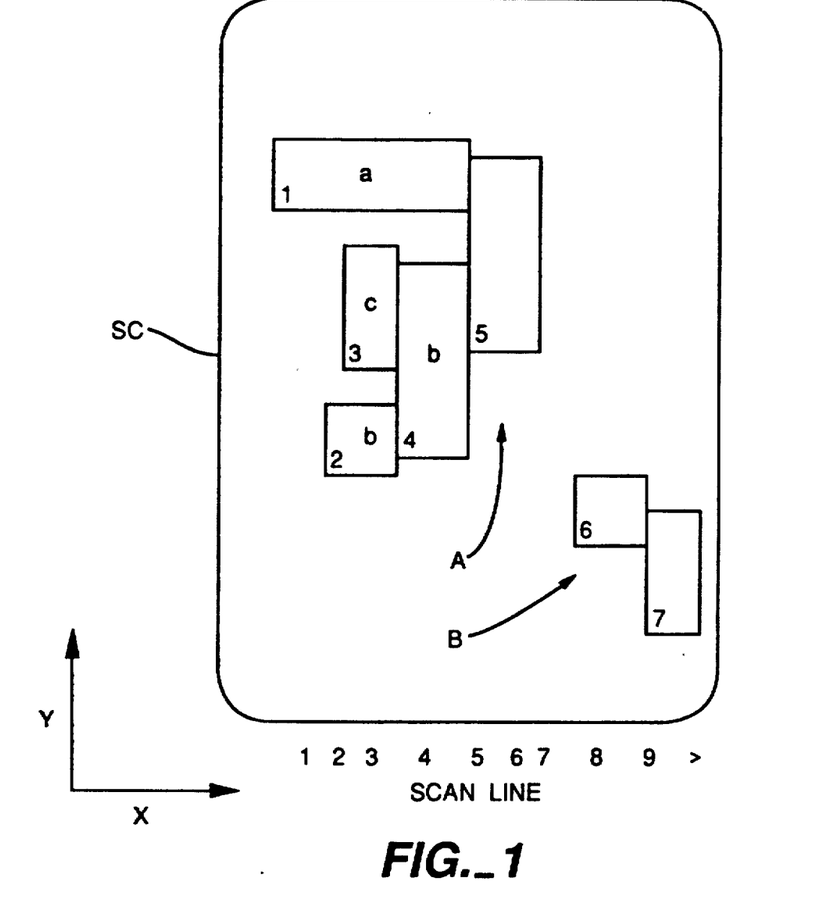
FIG. 1 is an illustration of an integrated circuit layout.
Figure 2:
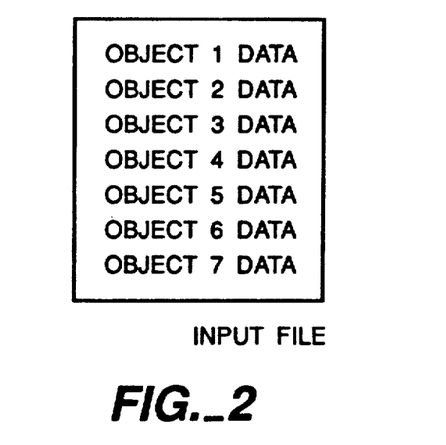
FIG. 2 is one example of an input file which might be associated with the circuit layout of FIG. 1.

For example, as shown in FIG. 2, the input file for the FIG. 1 circuit layout might consist of data which identifies the edges of each of the objects 1-7. Because the memory space required to store the interrelationships of the object edges could be great, which is particularly true for a large integrated circuit, this information is not included in the input file. Rather, integrated circuit analysis is used to determine the outer boundaries of the objects which together define the outer boundaries of the polygons A and B.

Figure 3:
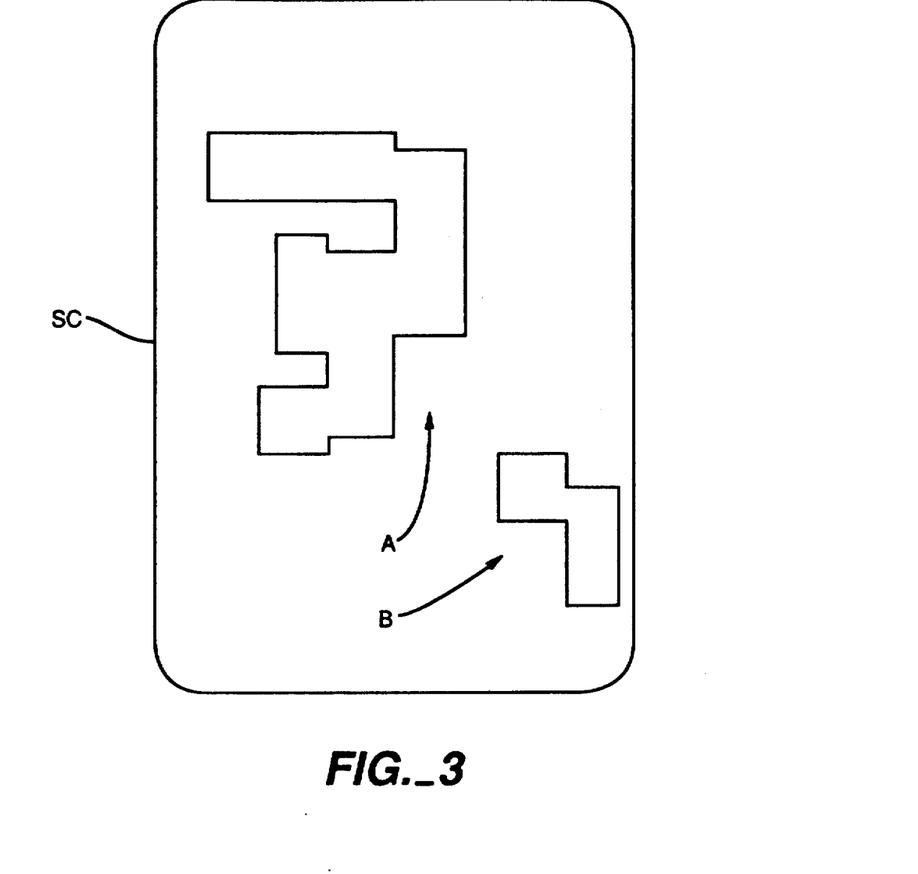
FIG. 3 is an example of the appearance of the FIG. 1 circuit layout which might be produced on the basis of data which is included in an output file following integrated circuit analysis.

An analysis of the integrated circuit shown in FIG. 1 would result in the production of an output file containing data corresponding to the interrelationships of the objects (for example, object edges) which form the polygons A and B, as shown in FIG. 3. As can be seen in FIG. 3, the integrated circuit analysis of the FIG. 1 circuit using the information stored in the input file provides a reconciliation of the object edges which intersect or overlap to form a single polygon.

The first step of integrated circuit analysis then involves separately labelling the individual objects which compose the polygons of the circuit layout by assigning a number, letter or other identifying feature to each of the objects. A goal of integrated circuit analysis is to permit the direct determination of connectivity within the circuit layout even though the objects do not touch at the point on the circuit layout currently being examined. In other words, the goal is to assign identifiers (e.g., numbers) to the various objects such that if two object identifiers are equivalent, the objects can be considered to be part of the same polygon, and thus part of the same electrical node.

Because the layer of a semiconductor chip is two-dimensional, a two-dimensional traversal process can be effectively used to achieve this goal. Almost all two-dimensional traversal methods used for integrated circuit analysis utilize scan line methods. Tree or other hierarchical region-oriented query methods either involve too much overhead (i.e., excessive memory space and processing time is associated with the query method) or require that substantially all design data associated with the circuit layout be placed into memory. Although storing all of the design data may work for smaller circuit layouts, it would not be feasible for larger designs. Since circuit layout analysis often requires a flattened representation of the data, this latter requirement renders the use of tree or region-oriented query methods impractical.

On the other hand, a scan line which is passed over an integrated circuit layout is able to detect all of the objects in the layout that happen to touch or cross the scan line at any given time. Thus, the scan line can be used to detect actual geometric data regarding the interrelationship of the objects on an integrated circuit layout which currently contact the scan line. By accumulating or storing information about previous scan lines, global information can be constructed.

Known two-dimensional traversal methods typically sort the design data to be gathered by the scan line into some order for analysis. For example, all points which form a portion of the circuit layout (e.g., a polygon) can, when viewed on a two-dimensional plane, be represented by an X and a Y value. Similarly, all edges or objects which form part of a polygon can be represented by sets of X and Y values. Accordingly, one example of a sorting criterion would be to sort detected data or information (e.g., data corresponding to the edge of an object forming part of a polygon) first by the lower X value of the data and then by the lower Y value of the data.

To implement a scan line traversal, a scan line is passed over the plane which includes the circuit layout. Only the objects that touch or intersect the scan line at a given time are kept in memory, ordered along the scan line in accordance with the selected sorting criterion. The scan line is traversed from an initial scan line coordinate value to the next point where an "event" occurs. At the least, an "event" is defined as a scanned point at which data is to be stored, such as the beginning or ending of an object.

For example, as shown in FIG. 1, a vertical scan line which is parallel to the Y axis and having a selected X coordinate is traversed from an initial Y value to the next Y value where an "event" occurs (such as the initial encounter of an object edge). At this latter Y value, data is obtained from the circuit layout by analyzing the scan line for all points or objects which contact the scan line, beginning with the object in the scan line having the lowest Y value. The vertical scan line is then moved to the next X coordinate value and the process repeated in the Y direction.

Accordingly, if during the traversal of a particular scan line in the Y direction, the beginning of an object is encountered (e.g., the lower left hand corner of an object which forms a part of a polygon), data related to the occurrence of that event will be stored. Some scan line methods, particularly object merging and overlap removal methods, also mark events and store data at any intersection between two objects, even if they do not occur at the ends of the objects.

When labelling polygons, a temporary number is assigned when an object is first noticed by the scan line, and this temporary number is updated when necessary. This updating occurs, for example, when two objects with different numbers touch at some point, as is the case when the two objects form part of the same polygon. Such updating is necessary if, as mentioned above, all objects which form part of the same polygon are to be commonly labelled.

For example, the decimal numbers in each object of FIG. 1 represent the order in which they are read from the FIG. 2 input file as the scan line passes across the circuit layout. For this reason, the temporary numbers assigned can be considered canonical members. As noted above, the memory space required for storing the shapes (e.g., the edges) of the various objects is relatively small such that the expense of preparing the FIG. 2 input file is minimal. However, because the memory requirements for storing the interrelationships of the various objects in a circuit layout are relatively large and costly, this information is not included in the input file. Rather, as mentioned above, this information is derived using a labelling scheme as will now be described more fully.

Referring again to FIG. 1, the lower case letters represent the temporary "numbers" used to identify an object before the object is written to an output file. In FIG. 1, the series of parallel, vertical lines numbered 1 through 9 correspond to the various X locations of the vertical scan line at which data regarding the circuit layout is stored for later production of an output file.

During the integrated circuit analysis of the circuit layout shown in FIG. 1, the scan line number 1 corresponds to the detection of the left edge of the object 1. Accordingly, the object 1 of the left-most polygon A is read from the input file first. Since none of the temporary object numbers have been assigned, this first object is assigned a "number" represented by the letter "a". The object number 2 is read next, and since it does not touch the object 1 directly, a new number (i.e., the letter "b") is assigned. A similar assignment of a new number "c" occurs when the object 3 is first encountered by the scan line as it moves across the FIG. 1 circuit layout.

When the fourth scan line, as shown in FIG. 1, is processed, it is immediately recognized that the object 4 contacts the object 2. Accordingly, the temporary number for the object 2 (i.e., the letter "b") is given to the object 4. With further processing along the fourth vertical scan line, it is found that the object 3 also contacts the object 4, but that it has a different temporary number (i.e., the letter "c"). As a result, data must be stored to indicate that the temporary number for the object 3 or the object 4 (or both) must be changed since the goal is to commonly number all objects which are in contact with one another.

Thus far, the only objects affected have been those located within the vertical scan line currently being processed. Accordingly, the temporary numbers of the objects encountered up to this point in the FIG. 1 circuit layout could be easily assigned or updated by the storage of a relatively small amount of information.

However, a different situation occurs when, for example, the object 5 is encountered by the fifth scan line and is found to contact the objects 1 and 4. In this case, the objects 2 and 3 are no longer in the scan line. Accordingly, excess memory space is required to store information regarding the complete circuit layout so that the number assigned to the object 5 will be assigned not only to the objects 1 and 4, but to the objects 2 and 3 as well.

One existing method for labelling polygons to accommodate this situation involves storing all of the objects for a given polygon in memory during a scan line pass. With this method, all of the objects for each polygon are saved in memory until the entire polygon has been passed (e.g., information regarding all of the objects 1-5 with respect to the polygon A and information regarding the objects 6-7 with respect to polygon B of FIG. 1). At this time a common number, or label, is assigned to all of the contacting objects, and all of the objects are written to the output file. This method is described by Franco Preparata and Jurg Nievergelt in "Plane-Sweep Algorithms for Intersecting Geometric Figures," Communications of the ACM 25(10), pp. 739-747, Oct. 1982.

However, the largest polygons will typically cover a large fraction of the circuit layout design area. Furthermore, the size of a list of the objects can be much greater than the amount of memory available. Accordingly, this method is not feasible except for very small design areas and/or polygons.

A second existing method for labelling polygons involves saving global topology information in memory. In this method only the object merging information is saved in memory during a first scan line pass of the integrated circuit layout. Such merging information would include, for example, information regarding objects which have been determined to be in contact with one another during the first scan line pass (e.g., information regarding the contact between objects 1 and 5, objects 2 and 4, objects 3 and 4, and objects 4 and 5 of FIG. 1). Afterwards, some processing is performed to reconcile all of the merge operations, and this information is then used to name, or label, the polygons during a second pass of the scan line over the circuit layout.

Figure 4:
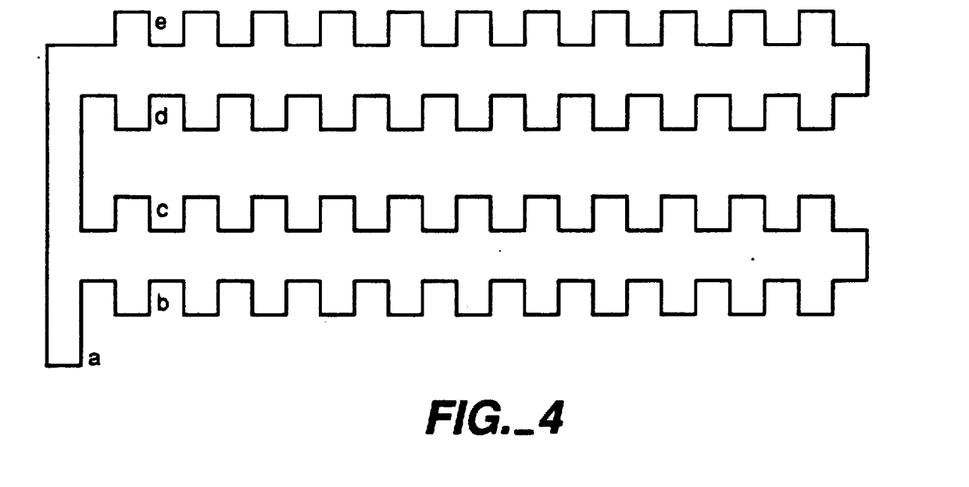
FIG. 4 is another example of an integrated circuit layout which includes a pathological polygon corresponding, for example, to a semiconductor chip's power supply; and, FIGS. 5, 6 and 7 illustrate various integrated circuit layouts which can be analyzed using the inventive method.

In a pathological case such as that shown in FIG. 4, this can require O(n) space, and the reconciliation can require O(n) to $O(n^2)$ time, where n is the number of edges in the integrated circuit network. More specifically, assume a scan line parallel to the X axis (i.e., a horizontal scan line) is passed from the bottom to the top of the circuit layout shown in FIG. 4. Since each downward-extending tab shown in FIG. 4 initially appears to be a separate object during such a scan of the circuit layout, the number of merge events can approach the number of objects in the input data file.

That is, all of the tabs in the rows marked b and d of FIG. 4 must eventually be merged with the remainder of the polygon. Since the number of edges in the tabs is arbitrary, it is not feasible to keep them all in memory awaiting resolution. The rows marked c and e will not, however, require any merge information as all of the edges in these rows are immediately recognized via the horizontal scan line as being part of the same overall polygon.

In the FIG. 4 example, the number of merge events will therefore approach one half of the object count. If, on the other hand, there were no tabs extending upwards in the FIG. 4 polygon, the event count could near the object count. This latter example is topologically similar to a polygon which represents a typical power supply node. Global topology methods similar to that mentioned herein are described by Henry S. Baird in "Fast Algorithms for LSI Artwork Analysis," Journal of Design Automation and Fault-Tolerant Computing, 2(2), pp. 179-209 (1978); paul Losleben and Kathryn Thompson, "Topological Analysis for VLSI Circuits," Proceedings of the 16th Design Automation Conference, pp. 461-473 (1979); Takashi Mitsuhashi, Toshiaki Chiba, Makato Takashima, and Kenji Yoshida in "An Integrated Mask Artwork Analysis System," Proceedings of the 17th Design Automation Conference, pp. 277-284 (1980); and David Noice, John Newkirk, and Rob Mathews in "A Polygon Package for Analyzing Integrated Circuit Designs," VSLI Design 2(3), pp. 33-36 (1981).

A third method of labelling polygons to accommodate the aforementioned object number updating situation involves writing all information, such as polygon start, object merging and polygon end information, into a temporary file. This method was first described by Szymanski and Van Wyk, (see, for example, Thomas G. Szymanski, "Space Efficient Algorithms for VLSI Artwork Analysis," Proceedings of the 20th Design Automation Conference, IEEE (1983)). With this method, two passes are made through the data contained on the circuit layout: a first pass of a scan line over the circuit layout to determine which objects contact each other (the scanning phase), and a second backward pass through the data representing the circuit layout to determine the final object numbers (the renaming phase).

In the first scanning phase, objects are read from the input file and temporary object numbers are assigned to each separate object (or edge) encountered by the scan line. The temporary numbers are stored with objects in a temporary file when the objects are scanned during the first pass. The temporary file includes control information mixed with output objects (or edges) that have been assigned temporary numbers. Every time an event occurs, a record of that event is written to the temporary file. In this method, an event is defined as:

1. The beginning of a polygon (i.e., the beginning of an electrical node) which, for example corresponds to the initial detection of an object boundary line which does not contact other previously detected objects; such a detection corresponds to the assignment of a new canonical number.
2. The ending of a polygon (i.e., the ending of an electrical node) which, for example, corresponds to the detection of another boundary line for a previously detected object, wherein the object boundary line is not in contact with any other objects. An event which corresponds to the detection of an end of a polygon (e.g. the top of a polygon when a horizontal scan line is used) results in the release of a canonical number such that it can be later used for a different polygon.
3. The merging of one object associated with a polygon or an electrical node into another object originally associated with a different polygon or electrical node.
4. The end of an input object. Such an event may have one of the previously listed events associated with it as well, such as a merge or an end of polygon event. The canonical number of the input object as determined during the first pass of the scan line is saved with the object in the temporary file.

Storing the events that occur during the scanning phase allows the reconstruction of the state of the scan line during the renaming phase. During the renaming phase, the temporary file is read in reverse order during a backward pass through the circuit layout to take advantage of the information gathered. In this regard, the following rules of reconstruction are followed to rename the polygons:

1. When an end-of-node marker is found with an object in the temporary file, the canonical number the object references is set aside and a final name (thus this is the "renaming" phase) is assigned; this final name will be associated with each object that is determined to reference that canonical number during the backward pass, indicating that it is part of the same polygon.
2. When a merge-objects marker is found with an object read from the temporary file, one of the two merging objects is considered to be the winner and the other object is considered to be the loser; the winner object is normally the object which appears first in the temporary file during the backward pass through the temporary file. The canonical number of the object which is considered to be the loser object is updated with the final name associated with the object considered to be the winner.
3. When a beginning-of-node marker is found with the object read from the temporary file, the canonical number is released (for later reuse, if necessary) thus indicating the end of the polygon.
4. When an object is encountered, its final name is assigned according to its canonical number, as saved during the first scan line pass. This object and its associated control information is then written to the output file and recorded therein.

The information is thus stored in a forward order during the first pass, and is read in a reverse order during the second pass. The output file is written in reverse order as well. Accordingly, either an additional pass through the output file is required to reverse the data once again for outputting the data in proper order, or the output file must be allocated in full and then written in reverse order.

For example, considering an analysis of the FIG. 1 circuit layout in general, an input file might list all of the objects 1 through 7 as shown in FIG. 2. During the aforedescribed first scan line pass of the circuit layout, a temporary file might be produced which includes temporary object numbers mixed with such information as the beginning of a polygon, the end of a polygon and object merge information.

During the renaming phase, the circuit layout is "scanned" in reverse order and the temporary file is read backwards. Thus, for example, the object 7 is read first, and is found to have an associated end of polygon marker. Accordingly, a final polygon name is assigned to the object 7. Further scanning of the layout and processing of the temporary file reveals that the object 7 merges with the object 6. Accordingly, the final number assigned to the object 7 is also assigned to the object 6. When the object 6 is scanned, a beginning-of-node or beginning-of-polygon marker is read from the temporary file and indicates that no other objects are associated with the polygon consisting of the objects 6 and 7. A similar analysis is then performed on the objects 1 through 5, whereby the interrelationship of these objects defines the connectivity associated with the polygon A.

At this point, the information regarding the polygons included in the circuit layout is stored in the output file in reverse order. Thus, as mentioned above, the output file could be written in reverse order to properly identify the objects of the polygons in the order with which they were encountered during the first pass.

The aforedescribed third method of labelling polygons provides greater efficiency than either of the previously described methods. However, because many computer operating systems impose a severe speed penalty when reading a file backwards, one drawback of this labelling process is that it tends to be input/output bound; i.e., it spends time waiting for the next block of data from the computer operating system. This is especially true in the final phase of polygon labelling, wherein the output file is in exactly backwards order. With such an approach, although no processing is required to reverse the file, it still must be read from the end so that the final output may be written from the beginning.

A further drawback of the Szymanski-Van Wyk approach is that it writes all of the input file data to the temporary file, plus polygon start, merge, and ending information. As a result, the temporary file is significantly larger than the input file and thus requires a substantial amount of disk space.

Accordingly, there is a need for a more efficient method of updating object numbers during polygon labelling which would operate more efficiently and cost effectively when two temporary object numbers associated with the same polygon must be reconciled.

SUMMARY OF THE INVENTION

Accordingly, it is an object of the present invention to provide a more efficient method of performing connectivity analysis and/or design rule checking during the analysis of an integrated circuit layout. More specifically, it is an object of the present invention to provide a method for assigning numbers to polygons which offers significant performance and space allocation advantages and which does not require any file to be read in reverse order.

In accordance with the present invention, a method is disclosed for labelling polygons of an geometric layout which includes the steps of:
scanning the geometric layout during a first scan line pass;
processing the scan line at each occurrence of an event to detect objects which contact the scan line;
assigning temporary numbers and root designators to the objects which contact the scan line in accordance with a sorting criterion;
updating the temporary numbers assigned to the objects to keep the temporary number associated with the earliest root designator of each separately detected polygon; and,
renaming each object which forms a part of the same polygon with a common label, said step of updating including the steps of:
numbering each object in a polygon with a temporary number previously assigned to a root object of the polygon; and,
storing, in a sorted order, root objects which lose their status as root objects during the step of updating.

For purposes of the present invention, a root of a polygon is the first object encountered by the scan line which is associated with the polygon. Accordingly, a root object corresponds to the beginning of a new electrical node and to a new canonical number. The root number is unique for each root object. Root numbers are assigned in increasing order.

BRIEF DESCRIPTION OF THE DRAWINGS

Other objects and advantages will become apparent from the following detailed description of preferred embodiments of the invention as described in conjunction with the accompanying drawings wherein like reference numerals are applied to like elements and wherein.

DETAILED DESCRIPTION OF THE PREFERRED EMBODIMENTS

Figure 5:
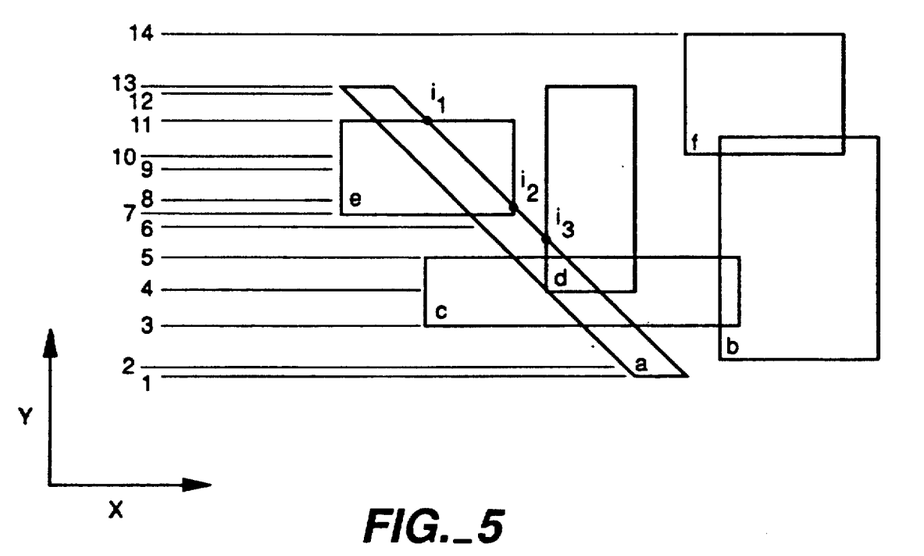

The circuit layout shown in FIG. 5 represents a multi-layer semiconductor chip design.

The integrated circuit analysis of the present invention is made possible by initially dividing the polygons of the integrated circuit layout into a set of trapezoidal objects having horizontal upper and lower boundary lines.

For purposes of the present invention, specific reference will be made to the use of trapezoidal objects as the basic objects of a polygon which are to be detected during a scan line analysis of an integrated circuit layout. It will be appreciated, however, that the invention can be utilized with other types of objects. Accordingly, for purposes of the present invention, "objects" in this sense is taken to mean any data representation, edge, point or the like. Additionally, any references to vertical edges are taken to include diagonal edges as well.

The edges, and thus the shapes of these trapezoidal objects, or trapezoids, are stored prior to the integrated circuit analysis in an input file similar to that discussed with respect to FIG. 2. During the scanning of the circuit layout as will be discussed hereinafter, the input file is accessed to obtain information with respect to each object encountered by the scan line.

Assuming that each of the trapezoidal objects located on the various layers of the semiconductor chip layout depicted in FIG. 5 are intended to be in contact with one another, they can be considered to represent a single polygon, and thus a single electrical node. In this regard, it should be mentioned once again that the purpose of integrated circuit analysis is to perform design rule checking and/or connectivity analysis.

An analysis of an integrated circuit layout in accordance with the present invention is begun by scanning the layout with a scan line. For purposes of the present description, reference will be made to the use of a horizontal scan line to provide a practical illustration of the features and advantages which the present invention offers. It will be appreciated, however, that the invention can be practiced with any type of scan line which can be passed over the circuit layout to derive data therefrom.

For example, it would be readily apparent to one skilled in the art that a vertical scan line could also be used to analyze an integrated circuit layout in accordance with the method of the present invention. With the use of a vertical scan line however, it would be more advantageous to break the polygons of the circuit layout into objects having two parallel, vertical sides (as opposed to the two parallel, horizontal sides mentioned above) for reasons which will become clear from the discussion below.

The scan line is processed at each occurrence of an event to detect objects on the integrated circuit layout which contact the scan line. The numbered values on the left-hand side of FIG. 5 correspond to Y locations of the horizontal scan line whereat an "event" is detected which requires processing of the scan line.

For purposes of the following description and as a practical illustration of the present invention, an "event" corresponds to the detection of the non-horizontal edges of a trapezoidal object at various points of an object. That is, an event occurs when a non-horizontal edge (i.e., vertical or diagonal) of an object is first encountered by the scan line or when the non-horizontal edge of an object disappears from the scan line. An event thus occurs at the detection of the beginning and/or end of a polygon or an electrical node. An "event" also occurs at the detection of contact between trapezoidal objects which are part of the same polygon, indicating that the two trapezoids should be merged.

For example, as shown in FIG. 5, the horizontal scan line will detect intersections of the non-horizontal edges of the various objects which form the single polygon shown. Such a scheme of detection enables the data obtained during a scan line analysis of the circuit layout to be ordered in the X direction along the scan line for each Y value at which an event is detected. Because integrated circuits are normally formed with a plurality of layers, it is important that such an ordering of events be maintained during the scan line analysis for purposes of the present invention.

Horizontal edges of the objects included in the circuit layout need not be detected by the horizontal scan line. That is, sufficient data is derived from the input file and from the vertical edges of the objects to determine the interrelationships of the objects. For example, when the lowermost left edge and the lowermost right edge of a trapezoid such as the trapezoid "b" in FIG. 5 are detected, it can be presumed that a lower horizontal boundary line exists because the overall shape of the trapezoidal object "b" is known. (It is for this reason that, as mentioned above, it would be desirable to break the polygons of a circuit layout into trapezoidal objects having parallel, vertical edges when a vertical scan line is used).

Furthermore, using the aforedescribed exemplary scan line method for purposes of the present invention, it would not be necessary to record the point $i_1$ at the intersection of the upper boundary of the trapezoid "e" with the trapezoid "a" in FIG. 5. Rather, the detection of the intersection $i_2$ and the detection of the upper boundaries of the trapezoids "a" and "e" (via the detection of the non-horizontal edges of the objects) would indicate an implicit intersection of the trapezoid "a" with the upper edge of the trapezoid "e". However, if for purposes of the analysis being performed it was essential that the upper right-hand corner of the trapezoid "e" be identified, the intersection at the point i₁ could be separately recorded.

When a non-horizontal edge of a trapezoidal object which forms the beginning of a new polygon is detected by the scan line, the object is assigned an arbitrary temporary number and a sequentially increasing root number.

Some examples of sorting criteria which could be used with the horizontal scan line of the present invention would include:

1. Sort first by lower Y value, then by lower X value of an edge of a polygon;
2. Sort first by lower Y value, then by lower left X value of an object which forms a part of a polygon; or,
3. Sort first by lower Y value, then by minimum left X value of an object which forms part of a polygon.

For purposes of the following discussion, a sorting criterion will be described for use with the horizontal scan line which involves sorting first by the lower Y value of an object and second by the lower left X value of an object. Thus, for example, objects in the FIG. 5 circuit layout would be detected and sorted according first to their appearance from bottom to top in the Figure, and second to their appearance from left to right on the horizontal scan line.

Table 1 reflects the processing which would occur along a horizontal scan line passed over the FIG. 5 circuit layout. This Table also indicates when a trapezoid will be removed from the scan line at a particular Y value due to the detection of an upper boundary of that trapezoid.

TABLE 1

| Scan Line Processing for FIG. 5 | | |
|---|---|---|
| Scan Line | Processing Order | Trapezoids Removed |
| 1 | a | — |
| 2 | a. b | — |
| 3 | c. a. b | — |
| 4 | c. a. d. b | — |
| 5 | c. a. d. b | c |
| 6 | a. d. b | — |
| 7 | e. a. d. b | — |
| 8 | e. a. d. b | — |
| 9 | e. a. d. f. b | — |
| 10 | e. a. d. f. b | b |
| 11 | e. a. d. f | e |
| 12 | a. d. f | d |
| 13 | a. f | a |
| 14 | f | f |

Referring now to the integrated circuit layout shown in FIG. 6, a preferred method for updating temporary numbers assigned to the objects in accordance with the present invention will be described. The updating process has been chosen to keep the "lowest" temporary canonical number associated with each separately detected polygon during the first scan line pass of the circuit layout.

That is, each object in a polygon is numbered with the temporary canonical number previously assigned to a "root object" of the polygon. For example, in a method to be discussed more fully below, each of the trapezoids 6-8 of the lower most polygon shown in FIG. 6 are numbered with one of the canonical numbers previously assigned to the root objects, or roots, 1-5 (i.e., the canonical numbers "a" through "e").

Figure 6:
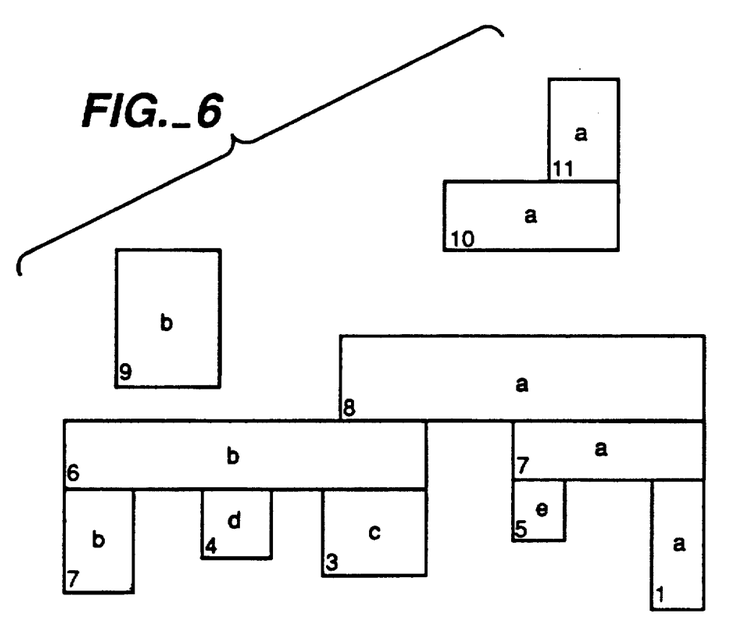

For example, the trapezoid number 1 is the root object, or root, of the lower most polygon shown in FIG. 6. However, when a horizontal scan line passing from the bottom to the top of the FIG. 6 circuit layout initially encounters each of the trapezoidal objects numbered 2 through 5, it is not yet known that they are all in contact with the object number 1 via the objects 6, 7 and 8. Accordingly, during the first scan line pass of the FIG. 6 circuit layout, all of the objects 1 through 5 are initially considered to be root objects for separate polygons. The trapezoids 2-5 will, however, lose their status as root objects once the lower most polygon in FIG. 6 has been entirely scanned, thus leaving the trapezoid 1 as the sole root object. The trapezoids which have lost their status as root objects are stored in a temporary file by ascending root number which is subsequently sorted in accordance with a method to be described more fully hereinafter.

Before discussing the aforementioned method of updating temporary object numbers in detail, the first scan line pass over the other polygons shown in FIG. 6 will be described. After it has been determined that the temporary numbers associated with the trapezoids 1 through 8 should be merged with the root object 1 due to their common contact, the temporary number "b" is available for reuse, and can therefore be assigned to the trapezoid number 9.

The temporary number "b" is used for the trapezoid number 9 at this stage in the analysis because the horizontal scan line which first encounters the trapezoid number 9 still encounters the trapezoid number 8 which has been labelled "a". Thus, because an upper boundary of the polygon which includes the trapezoid number 8 has not yet been encountered by the scan line, it is not yet known whether the trapezoids 8 and 9 will eventually be merged.

However, when the trapezoid number 10 is encountered by the scan line, the upper boundary of the trapezoid number 8 has already been removed from the scan line. The temporary number "a" is therefore available for reuse to identify the trapezoid 10 as being part of a new polygon. Because an upper boundary has also been encountered for the polygon associated with the trapezoid 9, the trapezoid number 10 can immediately be considered separate from the polygon associated with the trapezoid 9. It should be noted, however, that the temporary numbers referred to above are only indirectly related to the final polygon labels which are to be later assigned.

The method by which the temporary numbers assigned to the objects of a single polygon are updated during the course of the first scan line pass will now be described in detail. In accordance with the present invention, an absolute minimum amount of information is stored in the temporary file during the first scan line pass. Neither the temporary number which is assigned to a particular object during the first scan line pass nor the object itself are stored in the temporary file.

Rather, the present invention uses only object merge information to assign final polygon labels, or names, and this information is obtained solely from the roots of a polygon. Thus, only certain information regarding the roots of each polygon is stored in the temporary file during the first scan line pass in accordance with the present invention.

The updating of the temporary numbers is achieved as follows. When a trapezoid which is not a root object is encountered during the first scan line pass, it is assigned the canonical number of the root object which it contacts. For example, the trapezoid number 11 in FIG.

6 would be immediately updated with the canonical number of the root object number 10 during the first scan line pass.

However, when a trapezoidal object which is encountered is determined to be in immediate contact with two or more previously scanned objects which are each associated with different root objects (e.g., the object 6 in FIG. 6), a merger of the roots is performed. In this case, the two previously scanned objects are considered to be equivalent (i.e., in contact with one another) such that the temporary canonical numbers of the root objects assigned to their respective nodes must be merged.

At this time, one of the root objects is designated the "winner" and the other root object is designated the "loser". The root object identified as the loser is then marked with the temporary canonical number of the winner node's root object and stored in the temporary file. Thus, only objects which turn out to be loser roots of a polygon will be written to the temporary file (with the winner root's canonical number) during the first scan line pass.

When a merge operation as described above is to be performed, the root object which was first read from the input file during the initial scan line pass has the lowest root number and is considered to be the winner. In this way the temporary canonical number of the winner root is guaranteed to be "active" when an object associated with the canonical number of a loser root is read from the input file during a second scan line pass to be later discussed. A number is considered to be "active" when it is known that the node (or polygon) associated with the number is part of the scan lines currently being processed.

Figure 7:
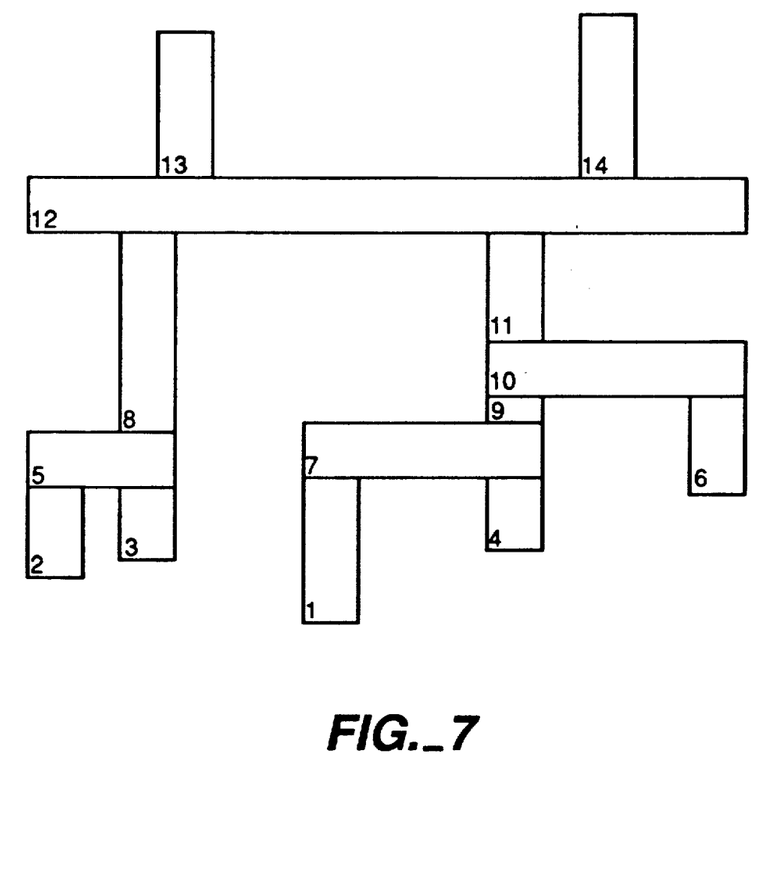

For example, the trapezoid number 5 in FIG. 7 requires that the canonical numbers represented by the trapezoids 2 and 3 be merged. When the trapezoid 5 is encountered by the scan line during the first scan line pass, it will be marked with the canonical number of the trapezoid 2. Immediately thereafter, it is found that the trapezoid 3 contacts the trapezoid 5 as well. Since the trapezoid 2 was read first from the input file during the scan line pass (using the sorting convention described earlier), it will be the winner. The trapezoidal object number 3 therefore constitutes the loser root which is written to the temporary file along with the canonical number of the trapezoid number 2.

Table 2 represents an illustration of the merging which occurs when the method of the present invention is applied to the circuit layout shown in FIG. 7. Since the entire set of trapezoids in FIG. 7 constitute one polygon, there will only be a single winner root at the completion of the first scan line pass; i.e., trapezoid 1. All of the other trapezoids determined to be loser roots of the polygon (i.e., the root objects 2–4 and 6) are marked with the canonical number of the root to which they lost, and are written to the temporary file during the first scan line pass.

TABLE 2

| | Canonical Node Merging for FIG. 3 | | | |
|---|---|---|---|---|
| Input Trapezoid | Initial Root Trapezoid | Final Root Trapezoid | Loser Written to File | (Canonical Number of Winner Root) |
| 5 | 2 | 2 | 3 | (2) |
| 7 | 1 | 1 | 4 | (1) |
| 10 | 1 | 1 | 6 | (1) |

TABLE 2-continued

| | Canonical Node Merging for FIG. 3 | | | |
|---|---|---|---|---|
| Input Trapezoid | Initial Root Trapezoid | Final Root Trapezoid | Loser Written to File | (Canonical Number of Winner Root) |
| 12 | 2 | 1 | 2 | (1) |

For example, it can be seen by referring to Table 2 that a merge operation will occur when the trapezoids 5, 7, 10 and 12 are encountered during the first pass of the scan line over the FIG. 7 circuit layout. As mentioned above, when the trapezoid number 5 is first encountered and read, the trapezoid number 2 is determined to be the winner root while the trapezoid number 3 is determined to be the loser root. The trapezoid number 3 is therefore written to the temporary file, marked with the canonical number of the trapezoid number 2. Similarly, when the trapezoid number 7 is encountered and read during the first pass of the scan line, the trapezoid number 1 is determined to be the winner root and the trapezoid number 4 is determined to be the loser root which is written to the temporary file.

When the trapezoid number 10 is encountered and read, the root trapezoid number 1 which has been associated with the trapezoid number 9 via the trapezoid number 7 is determined to be the winner. The loser root trapezoid number 6 is therefore written to the temporary file, marked with the canonical number of the root for trapezoid number 9 (i.e., the root number 1).

Finally, when the trapezoid number 12 is encountered and read, the root trapezoid number 2 which was associated with the trapezoid number 8 is initially identified as the lowest root associated with the trapezoid number 12. However, upon further analysis of the horizontal scan line contacting the trapezoid number 12, the trapezoid number 11 is encountered. The root associated with the trapezoid number 11 (i.e., the root trapezoid number 1) is therefore determined to be the winner root because the trapezoid number 1 was read first from the input file. Accordingly, the root trapezoid number 1 is the final root associated with the trapezoid number 12. The root object of trapezoid number 8 (i.e., trapezoid number 2) is then written to the temporary file, marked with the canonical number of the trapezoid number 11 (i.e., the root number 1).

Since only the loser polygon roots are written to the temporary file when a merge is detected, and since a later scanned object which is subsequently determined to be in contact with that root may be arbitrarily distant from the root, the temporary file is then sorted in accordance with the present invention, i.e., the temporary root file is not sorted when written and must be sorted before the second phase. This permits the temporary file to be used more effectively and cost efficiently. That is, a sorting of the temporary file avoids the time and expense of performing a backward pass through the temporary file even though it involves reading the input file a second time.

The information stored in the sorted temporary file at the completion of the first scan line pass of the FIG. 7 polygon is shown in Table 3. From Table 3, it can be seen that the merge information which had been placed in the temporary file has been sorted in accordance with the selected sorting criterion mentioned previously. This sorting of the temporary file permits the stored information to be accessed in the order with which the objects of the circuit layout are read from the input file during a second scan line pass. During the second scan line pass, to be discussed more fully below, the objects which form part of the same polygon are renamed with a common label.

TABLE 3

| Sorted Temporary File | |
|---|---|
| Loser Root written to file | (Canonical Number of Winner Root) |
| 2 | (1) |
| 3 | (2) |
| 4 | (1) |
| 6 | (1) |

More specifically, upon the completion of the first scan line pass, each object which forms a part of the same polygon is to be renamed with a common label. In a preferred embodiment of the present invention, this renaming of the objects is performed during a second scan line pass of the circuit layout in a forward direction.

That is, because the polygon roots are often below the scan line when a canonical merge is performed, they would ordinarily be released from the scan line before they are merged. This is why the aforementioned second scan line pass is used with the labelling method of the present invention.

As mentioned above, the input file represents a file which contains information regarding all of the trapezoidal objects included in the integrated circuit layout whose relationships with one another are to be detected during the scan line analysis. Accordingly, by again marking each object read from the input file with the canonical number of a root during the second scan line pass, it can be determined that objects which are associated with the same root are part of the same polygon and/or electrical node. Because the sorted temporary file will be accessed during the second scan line pass, the final name of a single root object can now be assigned to all of the objects that compose a particular polygon of the circuit layout. It can therefore be determined whether the desired interrelationships of the objects in the circuit layout have been retained.

Both the first and the second scan line passes over the circuit layout are therefore essentially equivalent. That is, in both passes, the scan line is moved in a forward direction over the circuit layout. In addition during both passes the objects are read from the input file as they are encountered by the scan line, and they are assigned canonical numbers.

The only difference between the two passes is that during the first pass, merge information (i.e., loser root information regarding objects which contact one another) is saved in the temporary file, while during the second pass the merge information is retrieved. That is, the information which was gathered during the first scan line pass of the circuit layout is retrieved by reading the sorted temporary file and the input file in a forward direction during the second pass.

From the above description, it can be seen that only one root is stored per active polygon during the first scan line pass. The term "active polygon" refers to an object which has not yet been determined to have merged with another object during the course of the first pass so as to lose its status as a separately identified polygon. For example, the trapezoids 1 and 2 in FIG. 7 are considered to be the roots of separately identifiable active polygons until their merger at the trapezoid number 12 is detected by the scan line.

Other trapezoids, still in the scan line, pointing to the loser root are updated the next time they are seen (i.e., during the second scan line pass). Thus, during the second scan line pass, each object read from the input file which is determined to be a loser root on the basis of the information stored in the temporary file, is assigned the final name of the winner root with which it is marked in the temporary file as shown in Table 3, using the canonical number saved in the temporary file to find the winner root. When the second scan line pass is completed, all objects associated with the same polygon will therefore be identified with the final name of the same root object.

In a preferred embodiment of the present invention, each root contains a reference count of the trapezoids in the scan line which still point to that root. That is, every time a trapezoidal object is encountered during the first scan line pass, the reference count of the root which that trapezoidal object references is incremented. Similarly, every time the canonical number of a trapezoidal object is updated at the occurrence of a merge operation, the reference count associated with the loser root is decremented.

When the count associated with a particular root reaches zero, the loser root is no longer pointed to, such that it can be released as a root during the second scan line pass without danger. That is, because the loser is no longer the root trapezoid for any other trapezoids, it no longer serves any effective purpose as a root. Accordingly, by releasing any reference to the canonical number of the trapezoid as a root, the need to make an extra pass across the scan line each time two nodes are merged is avoided.

For example, referring to FIG. 7, the trapezoid 6 is initially identified as a root object. However, when the trapezoid 10 is scanned, it is assigned the root number of the trapezoid 1. The trapezoid 6 will therefore immediately have an associated reference count of zero and can be released as a root during the second scan line pass without concern.

The first object read from the input file during the second scan line pass will immediately be assigned a canonical number as was the case with the first scan line pass. However, because this object should not appear in the temporary file (i.e., it should represent the single winner root object for a polygon), it is also assigned a unique final name for the overall polygon.

Whenever a winner root is encountered in the second scan line pass, a final polygon name can be directly assigned for the entire polygon. The root object and all other objects associated with the polygon can therefore be written to the output file with their proper final names immediately. The winner root is guaranteed to be active whenever a loser root is read from the input file during the course of the second scan line pass, since the winner root will always be read first from the input file and will be active until the last trapezoid that is part of the polygon is released.

Because a root object which is determined to be a winner following a merge operation during the first scan line pass is not written to the temporary file, the temporary file will be empty if no root object merging occurs during the first pass. In this case, the objects included in the circuit layout which are read from the input file can be labelled in one scan line pass.

Thus, in another preferred embodiment of the present invention, each object read from the input file is assigned a final label during the first scan line pass in the hope that no object merging will occur. This label, or name, is immediately written directly to the output file. However, this process is stopped, and the output file restarted in a second scan line pass, as soon as a merge is detected.

In yet another preferred embodiment of the present invention, a second pass of the information stored during the first scan line pass is implemented without scanning the circuit layout a second time. That is, the canonical numbers of the objects which are assigned during the first scan line pass are stored in a second temporary file. Thus, this embodiment operates on the premise that the canonical number of each object will be saved during the first scan line pass instead of being recalculated via the use of a scan line during the second pass.

The first scan line pass in this latter embodiment is therefore similar to the first scanning phase of Szymanski's method, except that the objects are immediately stored with their canonical numbers instead of delaying until the objects are released from the scan line. In this manner the second temporary file is retained in a sorted order such that the penalty of reading a file backwards is thus still avoided. In addition, the overhead (i.e., memory and time requirements) of passing a scan line over the data a second time is avoided.

The second pass through the temporary files is similar to the renaming phase of Symanski's method except that the temporary files are read forward. It can be described as follows. For each object in the second temporary file, a final name is obtained via the canonical number (in the same way as was described previously for the roots) and the object is written to the output with the final name. Objects determined to be polygon roots are flagged in the first scan line pass so that the final name may be assigned in the same manner as when a scan line was used for the second pass.

With this embodiment of the present invention, the single scan line pass of the circuit layout requires $$O(n\sqrt{n})$$

time because of the scan line overhead. However, the second pass through the first and second temporary files containing information gathered during the scan line pass only requires $O(n)$ time (i.e., a linear time second pass of the temporary files can be used). The cost, however, is writing the entire input file to the second temporary file during the scan line pass even though very little additional information is included in the second temporary file.

It will be appreciated by those of ordinary skill in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method for labelling polygons of a geometric layout which comprises the steps of:

scanning the geometric layout during a first scan line pass to detect objects which form a polygon;

processing the scan line at each occurrence of an event to detect the objects which contact the scan line;

assigning temporary numbers and root designators to the objects which contact the scan line in accordance with a sorting criterion;

updating the temporary numbers assigned to the objects to keep the temporary number associated with the earliest root designator of each separately detected polygon; and, renaming each object which forms a part of the same polygon with a common label, said step of updating including the steps of:

numbering each object in a polygon with a temporary number previously assigned to the root object of the polygon; and, storing, in a sorted order, root objects which lose their status as root objects during the step of updating.

2. The method of claim 1, wherein said step of renaming further includes:

scanning the geometric layout a second time.

3. The method of claim 1, wherein said step of updating further includes:

identifying a single root object for each polygon of the geometric layout.

4. The method of claim 3 wherein said step of renaming further includes:

scanning the geometric layout a second time; and, assigning to each object the common label which is correlated with the single root object for each polygon.

5. The method of claim 2, wherein the first scan line pass and the second scan line pass are in the same direction.

6. The method of claim 4, wherein the first scan line pass and the second scan line pass are in the same direction.

7. The method of claim 1, wherein said step of scanning includes:

passing a horizontal scan line vertically across the geometric layout.

8. The method of claim 7, wherein said step of storing includes:

sorting the objects in their order of appearance along the scan line.

9. The method of claim 1, wherein prior to said step of scanning, the polygons are broken into objects having parallel, horizontal upper and lower boundary lines.

10. The method of claim 1, wherein said objects detected during said step of scanning are nodes on the geometric layout.

11. The method of claim 1, wherein said step of renaming further includes the step of:

processing the temporary numbers assigned to the objects together with the stored numbers of root objects.

12. The method of claim 1, wherein the processing of the scan line occurs upon the detection of the non-horizontal edges of a trapezoidal object.

13. The method of claim 1, wherein the root objects which lose their status as root objects are stored in a first temporary file with a canonical number of a winner root object.

14. The method of claim 13, wherein said step of processing is performed at a beginning and at an end of a polygon.

15. The method of claim 13, wherein said step of processing is performed at a point of contact between objects.

16. The method of claim 1, wherein said sorting criterion includes the steps of:
sorting first by lower Y value, then by lower left X value of an object which forms a part of a polygon.

17. The method of claim 1, wherein said sorting criterion includes the steps of:
sorting first by lower Y value, then by minimum left X value of an object which forms part of a polygon.

18. The method of claim 1, wherein the root objects which lose their status as root objects are stored in accordance with said sorting criterion.

19. The method of claim 1, wherein said step of renaming further includes the steps of:
maintaining a reference count, for each root object, of the objects which have been assigned the temporary number of that root object; and,
releasing an object as a root when the reference count for that root object becomes zero.

20. The method of claim 13, wherein said step of numbering further includes the step of:
storing the temporary number of each object in a second temporary file.

21. The method of claim 20, wherein said step of renaming includes the steps of:
assigning a final name to each object placed in the second temporary file on the basis of information stored in the first temporary file.

22. A method for labelling polygons of a geometric layout which comprises the steps of:
scanning a geometric layout during a first scan line pass to detect objects which form a polygon;
processing the scan line at each occurrence of an event to detect the objects which contact the scan line;
detecting an occurrence of a root object merge operation;
assigning a label to each object which forms a part of the polygon during the first scan line pass;
writing said label for each polygon to an output file as a final label during said assigning step until a root object merge operation is detected;
initiating a second scan line pass when a root object merge is detected; and
restarting said writing to said output file upon initiation of said second scan line pass.

23. The method of claim 1, wherein said step of scanning includes:
passing a vertical scan line horizontally across the geometric layout.

24. The method of claim 23, wherein said step of storing includes:
sorting the objects in their order of appearance along the scan line.

25. The method of claim 1, wherein prior to said step of scanning, the polygons are broken into objects having parallel, vertical right and left boundary lines.

26. An integrated circuit fabricated using a process for labelling polygons which includes the steps of:
scanning the geometric layout during a first scan line pass to detect objects which form a polygon;
processing the scan line at each occurrence of an event to detect the objects which contact the scan line;
assigning temporary numbers and root designators to the objects which contact the scan line in accordance with a sorting criterion;
updating the temporary numbers assigned to the objects to keep the temporary number associated with the earliest root designator of each separately detected polygon; and,
renaming each object which forms a part of the same polygon with a common label, said step of updating including the steps of:
numbering each object in a polygon with a temporary number previously assigned to the root object of the polygon; and,
storing, in a sorted order, root objects which lose their status as root objects during the step of updating.

* * * * *